United States Patent
Wang et al.

(10) Patent No.: US 11,849,642 B2
(45) Date of Patent: Dec. 19, 2023

(54) 3D PRINTED AND IN-SITU POLED FLEXIBLE PIEZOELECTRIC PRESSURE SENSOR

(71) Applicant: Wisconsin Alumni Research Foundation, Madison, WI (US)

(72) Inventors: Xudong Wang, Middleton, WI (US); Jun Li, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 757 days.

(21) Appl. No.: 16/851,400

(22) Filed: Apr. 17, 2020

(65) Prior Publication Data
US 2021/0328130 A1 Oct. 21, 2021

(51) Int. Cl.
G01L 9/08 (2006.01)
B33Y 80/00 (2015.01)
H10N 30/084 (2023.01)
H10N 30/057 (2023.01)
H10N 30/092 (2023.01)

(52) U.S. Cl.
CPC ............ *H10N 30/057* (2023.02); *B33Y 80/00* (2014.12); *G01L 9/08* (2013.01); *H10N 30/084* (2023.02); *H10N 30/092* (2023.02)

(58) Field of Classification Search
CPC ........ B33Y 80/00; G01L 9/08; H10N 30/084; H10N 30/092
See application file for complete search history.

(56) References Cited

U.S. PATENT DOCUMENTS

| | | | | |
|---|---|---|---|---|
| 5,725,825 A | * | 3/1998 | Hotomi | C04B 35/622 264/435 |
| 6,049,160 A | * | 4/2000 | Safari | H10N 30/852 310/357 |
| 6,111,818 A | * | 8/2000 | Bowen | H10N 39/00 310/369 |
| 6,571,443 B2 | * | 6/2003 | Lally | G01P 15/0915 29/25.35 |
| 9,768,374 B2 | * | 9/2017 | Sakai | H10N 30/87 |
| 2004/0060362 A1 | * | 4/2004 | Kjellmann | G01L 9/08 73/754 |

(Continued)

FOREIGN PATENT DOCUMENTS

| | | | | |
|---|---|---|---|---|
| JP | 2004043624 A | * | 2/2004 | B32B 27/18 |
| WO | 2019227082 | | 11/2019 | |

OTHER PUBLICATIONS

Rafiq, M et. al., J Applied Materials, 2016, 8, 33755-33764 (Year: 2016).*

(Continued)

*Primary Examiner* — Peter Dungba Vo
*Assistant Examiner* — Jose K Abraham
(74) *Attorney, Agent, or Firm* — Boyle Fredrickson S.C.

(57) ABSTRACT

A piezoelectric artificial artery can be 3D printed to provide the real-time precise sensing of blood pressure and vessel motion patterns enabling early detection of partial occlusions. An electric-field assisted 3D printing method allows for rapid printing and simultaneously poled complex ferroelectric structures with high fidelity and good piezoelectric performance. The print material consists of ferroelectric potassium sodium niobate (KNN) particles embedded within a ferroelectric polyvinylidene fluoride (PVDF) polymer matrix.

22 Claims, 2 Drawing Sheets

(56) References Cited

U.S. PATENT DOCUMENTS

| | | | | |
|---|---|---|---|---|
| 2010/0010600 | A1* | 1/2010 | Eriksson | A61B 5/0215 |
| | | | | 29/25.35 |
| 2013/0161023 | A1* | 6/2013 | Phadke | G01F 23/22 |
| | | | | 166/355 |
| 2014/0130319 | A1* | 5/2014 | Iwamoto | H03H 9/059 |
| | | | | 29/25.35 |
| 2014/0203690 | A1* | 7/2014 | Sakai | H10N 30/40 |
| | | | | 29/25.35 |
| 2016/0181506 | A1* | 6/2016 | Sirbuly | H10N 30/092 |
| | | | | 264/41 |
| 2016/0322560 | A1* | 11/2016 | Sirbuly | H10N 30/80 |
| 2017/0160147 | A1* | 6/2017 | Genmei | G01B 7/22 |
| 2019/0109274 | A1* | 4/2019 | Ogasahara | H10N 30/302 |
| 2020/0321516 | A1* | 10/2020 | Chiang | H10N 30/045 |

OTHER PUBLICATIONS

Juan Tamez, Masters Thesis University of Texas 2009 (Year: 2009).*

Kim et al., 3D Printing of BaTiO3/PVDF Composites with Electric In Situ Poling for Pressure Sensor Applications, Macromolecular Materials and Engineering 2017, 302, 1700229, pp. 1-6.

Song et al., Co-Continuous Piezocomposites with Triply Periodic Phase Interfaces for Enhanced Mechanical Flexibility and Piezoelectricity, MSEC2018-6704, pp. 1-9.

Cholleti, A Review on 3D Printing of Piezoelectricmaterials, IOP Conf. Series: Materials Science and Engineering 455 (2018).

Lee et al., "Electric Poling-Assisted Additive Manufacturing Process for Lead-Free Piezoelectric Device Fabrication", Procedia Manufacturing, vol. 1, 2015, pp. 320-326.

* cited by examiner

3D PRINTED AND IN-SITU POLED FLEXIBLE PIEZOELECTRIC PRESSURE SENSOR

STATEMENT REGARDING FEDERALLY SPONSORED RESEARCH OR DEVELOPMENT

This invention was made with government support under EB021336 awarded by the National Institutes of Health. The government has certain rights in the invention.

CROSS REFERENCE TO RELATED APPLICATION

--

BACKGROUND OF THE INVENTION

The present invention relates to a 3D printed piezoelectric material suitable for use as a transducer, and more particularly, a 3D printed artificial blood vessels with piezoelectric response for real-time blood pressure sensing.

Vascular replacement is a common surgical procedure for repairing clot-obstructed or non-functional blood vessels in the treatment of coronary disease, stroke, and limb-threatening ischemia. About 450,000 prosthetic vascular graft implantations have been conducted annually in the United States.

Biomimetic vascular grafts are created with heterogeneous properties close to those of native tissues and precisely matching the anatomy of the individual, allowing for patient-specific implants. However, 40-60% of vascular grafts still fail within the first year of implantation, which results in morbidity and even mortality. One of the primary reasons for graft failure is stenosis and occlusions to the blood vessel.

It is essential to closely and timely monitor the associated local physiological signals (e.g., blood flow pressure, graft flow velocity, and variation in lumen dimensions) in order to detect hemodynamically significant lesions at early stages. Currently, implanted blood vessels require a series of surveillances at defined time intervals in clinics using sophisticated equipment (such as ultrasound imaging devices, blood cuff, and contrast enhanced computerized tomography (CT)), which are inadequate and ineffective to timely detect complications and prevent failure.

Treating graft failure (e.g., occlusions) often requires complex surgical procedures associated with a high mortality rates of up to 5% and only 25% of failed grafts being successfully salvaged. Therefore, real-time monitoring of implanted vascular grafts is thus greatly desired to reliably identify complications and initiate early treatment, which can be performed through a safer and less invasive procedure (e.g., local angioplasty through an endovascular procedure) than treating graft failures.

SUMMARY OF THE INVENTION

The present invention provides complex biomimetic artificial blood vessels made from ferroelectric materials with piezoelectric responses to better monitor local physiological signals and detect hemodynamically significant legions at an early stage. Ferroelectric materials are an ideal selection for precision pressure and motion sensing owing to their outstanding piezoelectric responses. Their functionality can be utilized in all types of artificial organs and tissues.

Electric field assisted additive 3D printing is a promising method to quickly produce complex piezoelectric structures that precisely match the anatomy of individual patients (compared to conventional casting, molding or electrospinning technology). Although some attempts have been made to fabricate ferroelectric structures using 3D printing with electromechanical coupling properties, these structures require a long poling time (a process by which a strong electric field is applied across the material) to exhibit acceptable piezoelectricity. This greatly increases the manufacturing time. For 3D-printed ferroelectric materials, such as piezoceramics or lead-free materials, poling is difficult because they suffer from high electrical conductivity, high coercive field, or low breakdown strength due to their irregular shape and existence of internal pores. Thus, it can be difficult to apply a high enough electric field to obtain a preferred domain orientation. Moreover, the low Curie temperature (the critical temperature where materials lose their spontaneous polarization and ferroelectric state) of ferroelectric materials make it difficult to maintain their ferroelectric phase at the high printing temperatures required to extrude the filament material simultaneously.

The present invention provides an electric field assisted 3D printing method that allows for rapidly printed and simultaneously poled complex ferroelectric structures, i.e., tubular lattices, with high fidelity and good piezoelectric performance. The printed material consists of ferroelectric potassium sodium niobate (KNN) particles embedded within a ferroelectric polyvinylidene fluoride (PVDF) polymer matrix. The present inventors have found that the piezoelectric properties of the KNN particles with the PVDF polymer matrix, along with the sinusoidal structure, results in a composite that has heterogenous properties close to those of native tissues, can be poled at high print temperatures, and maintains strong piezoelectric properties post-poling.

The present inventors believe that there is a synergistic effect of the KNN particles and PVDF polymer matrix improving the quality of the composite piezoelectric material. Thus, a successful piezoelectric artificial artery can be 3D printed to provide the real-time precise sensing of blood pressure and vessel motion patterns enabling early detection of artificial blood vessel failure.

In one embodiment of the present invention, a tubular pressure gauge includes a tube having a tubular substrate of a piezoelectric material wherein the tubular substrate is poled perpendicular to inner and outer opposed surfaces of the tubular substrate; a first electrode on the first surface of the substrate; and a second electrode on the second surface of the substrate. A voltage meter is configured to detect a voltage between the first and second electrodes based on changes in pressure through the tubular substrate.

It is thus one feature of at least one embodiment of the present invention to utilize the piezoelectric properties of certain biocompatible materials to detect subtle vessel motion patterns within the body without external energy sources.

The piezoelectric material may be ferroelectric potassium sodium niobate (KNN) based piezoelectric particles embedded in a ferroelectric polyvinylidene fluoride (PVDF) based polymer matrix. The amount of KNN piezoelectric particles may be 30-40 vol %. The KNN based piezoelectric particles may have a Curie temperature of at least 250 degrees or at least 270 degrees or at least 300 degrees Celsius. The KNN based piezoelectric particles may have a piezoelectric coefficient of about 80-400 pC/n at room temperature.

It is thus one feature of at least one embodiment of the present invention to improve polarization of the composite material by incorporating piezoceramic particles with good ferroelectric properties and high Curie temperature into the polymer matrix without affecting printability.

The amount of PVDF polymer matrix may be 60-70 vol %.

It is thus one feature of at least one embodiment of the present invention to select a soft thermoplastic polymer that is easy to print, flexible, and has acceptable piezoelectricity as a suitable polymer matrix material. The polymer also has a relatively high dielectric constant assisting the polarization of the composite material.

The piezoelectric substrate may generate a voltage output of at least 2.5 V under an external force load of 30 N.

It is thus one feature of at least one embodiment of the present invention to provide high piezoelectric ability in order to detect the small fluctuations of blood vessels by blood pumping throughout the body.

The piezoelectric substrate may have a thickness of between 0.1-0.2 mm. The substrate may be a sinusoidal lattice. The lattice may be about 30% substrate and about 70% openings in the substrate. The lattice may be at least 60% openings or more openings than substrate.

It is thus one feature of at least one embodiment of the present invention to reduce the mechanical modulus by increasing the openings of the substrate, and to mimic the modulus of blood vessels by the sinusoidal lattice pattern of the substrate.

A sheath encapsulates the substrate and the first and second electrode and forms an outermost and innermost layer of the tube.

It is thus one feature of at least one embodiment of the present invention to provide self-powered sensing capability to artificial blood vessels that provides a suitable vascular graft substitute.

The sheath may be polydimethylsiloxane (PDMS). The thickness of the sheath layers of PDMS may be 1-2 mm.

It is thus one feature of at least one embodiment of the present invention to shroud the piezoelectric material within a biocompatible, flexible tube that can withstand the pressure of blood flowing through the blood vessel and without affecting the mechanical strain of the piezoelectric material.

The inner and outer electrodes may be silver ink.

It is thus one feature of at least one embodiment of the present invention to allow for transmission of electrical charge to and from the piezoelectric material.

The artificial blood vessel may have a tensile modulus of at least 5 MPa. The artificial blood vessel may have a flexural modulus of at least 10 MPa.

It is thus one feature of at least one embodiment of the present invention to mimic the biomechanical properties of blood vessels within the body with good durability for consistent, long term use.

In one embodiment of the present invention, a method of manufacturing a pressure sensor as described above including the steps of heating the composite of piezoelectric material at a temperature of at least 250 degrees Celsius to form a molten material; extruding the molten material through a 3D printer nozzle; applying an electrical field between the 3D printer nozzle and a lower build plate to pole the molten material; and depositing the molten material onto the build plate.

It is thus one feature of at least one embodiment of the present invention to rapidly produce artificial blood vessels that are sized to fit an individual patient's anatomy on a case by case basis.

The electric field may be applied in the range of 0.5 to 4 kV/mm and the applied voltage is increased with an increase in build height so that the electric field remains constant.

It is thus one feature of at least one embodiment of the present invention to apply a strong enough electric field across the material as the layers are added at elevated temperatures to pole the piezoelectric material properly.

The molten filament is deposited at a print speed of less than 20 mm/s.

It is thus one feature of at least one embodiment of the present invention to increase the poling time during printing to sustain the aligned dipole orientation in the ferroelectric material.

The method may include forming the tube by rolling the substrate wherein the tube has a diameter between 5 mm to 1.5 cm and extending a length of at least 1 cm. The method may further include the step of covering an outer surface of the tube with a layer of polydimethylsiloxane (PDMS).

It is thus one feature of at least one embodiment of the present invention to produce an artificial blood vessel structure mimicking human blood vessels in shape, size and biomechanical properties.

In one embodiment of the present invention, a method of 3D printing a substrate of piezoelectric material includes the steps of: heating a composite material of ferroelectric potassium sodium niobate (KNN) piezoelectric particles embedded in a ferroelectric polyvinylidene fluoride (PVDF) polymer matrix at a temperature of at least 250 degrees Celsius to form a molten material; extruding the molten material through a 3D printer nozzle; applying an electrical field between the 3D printer nozzle and a lower build plate to pole the molten material as the molten material is being extruded; and depositing the molten material onto the lower build plate to form the substrate; wherein the substrate is poled perpendicular to first and second opposed surfaces of the substrate.

The substrate may have a piezoelectric coefficient of at least 10 pC/N at room temperature.

These particular objects and advantages may apply to only some embodiments falling within the claims and thus do not define the scope of the invention.

DETAILED DESCRIPTION OF THE PREFERRED EMBODIMENT

Figure 1:
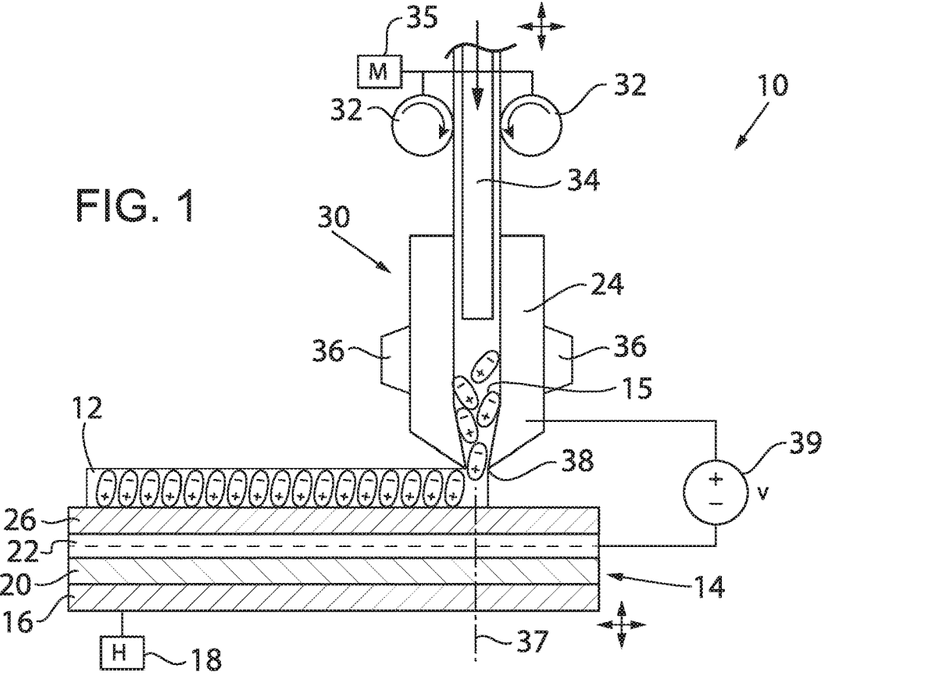
FIG. 1 is a schematic cross-sectional representation of one embodiment of the present invention showing a method of printing a piezoelectric print where the molten polymer composite is poled simultaneous with 3D printing extrusion to form the piezoelectric print on the print bed.

Referring to FIG. 1, a 3D printing system 10 of the present invention for fused deposition modeling (FDM) may be used with an electric poling process in the manufacture of piezoelectric substrates 12, for example, that may be used to manufacture artificial biological systems such as artificial arteries within the body.

The 3D printing system 10 may include a build plate 14 providing a substantially planar surface on which the extruded molten material is deposited, layer by layer, during 3D printing. The build plate 14 may be moved vertically up and down, for example, lowered as the layers are added, and translated in all directions within a plane of the build plate 14 to assist with building the shape of the printed object as understood in the art. The build plate 14 includes multiple layers of materials that are used to heat and/or support the extruded material 15 but also to produce an electric field between the build plate 14 and a print nozzle to pole the extruded material 15 as the molten material is deposited onto the build plate 14.

The build plate 14 may include a heat bed 16, forming a lowermost layer of the build plate 14, which provides a conductive material that keeps the extruded material 15 on the build plate 14 warm to prevent warping if the extruded material 15 is cooled too quickly. The heat bed 16 may be electrically connected to an electric resistance heater 18 as understood in the art that conducts heat to the conductive heat bed 16. In some embodiments, the heat bed 16 may be an aluminum plate or a glass plate.

An upper surface of the heat bed 16 may be optionally covered by a glass plate 20 that does not warp or bend under heat and provides a smooth upper surface, particularly when the heat bed 16 itself does not provide a smooth upper surface. In some embodiments, the heat bed 16 may be glass, for example, a tempered glass, removing the necessity for the glass plate 20 to cover the heat bed 16. Generally, the desired characteristics of the material of the upper surface of the heat bed 16, or glass plate 20 if included, are hard and rigid, high modulus of elasticity, and thermally stable (low thermal conductivity).

An upper surface of the heat bed 16, or glass plate 20 if included, will support an electrode layer 22, for example a copper foil, serving as a cathode of the electrical field assembly connected to a voltage source 39. A nozzle 24 serving as an anode of the electrical field assembly is also connected to the voltage source 39. The nozzle 24 and the electrode layer 22 produce an electric field as further described below.

An upper surface of the electrode layer 22 includes an adhesion layer 26 to assist with the adhesion of the extruded material 15 to a top of the uppermost layer of the build plate. The adhesion layer 26 may be a thin layer of polyvinyl alcohol (PVA) hydrogel, Kapton tape, masking tape or the like enhancing the adhesion of the lowermost print layer to the build plate 14. The adhesion layer 26 may have a thickness that is less than 50 micrometers.

The build plate 14 may have a surface area of at least 5 by 5 by 5 inches providing a sufficient surface area to build the printed object.

The 3D printing system 10 may include a filament extruder 30 including feeding rollers 32 that are driven by a motor 35 to drive the filaments 34 downward through the extruder 30 and into a conical nozzle 24 of the extruder 30. The nozzle 24 may be heated by a heater 36, such as a thermistor, thermocouple, or the like mounted to the extruder 30 and heating the nozzle 24 to further melt the filaments 34 as it flows through the nozzle 24 to dispel the extruded material 15 in molten form. The heater 36 may heat the nozzle 24 and filaments 34 to a temperature of at least 230 degrees Celsius, and at least 250 degrees Celsius, and between 230-290 degrees Celsius to cause the filaments 34 to properly melt and be properly extruded through the nozzle 24 without clogging.

The extruded material 15 may be expelled through a lower opening 38 of the nozzle 24 and deposited onto a top of the build plate 14. The lower opening 38 may have a diameter ranging from 0.1 mm to 1 mm.

The nozzle 24 may be manufactured of a heat and electrically conductive material such as brass, stainless steel, and hardened steel allowing for melting of the filament 34 and poling processes described below.

The filament extruder 30 of the 3D printing system 10 may be moved vertically up and down, for example, raising the nozzle 24 as the build layers are added, and translating in all directions parallel to the plane of the build plate 14 to assist with building the shape of the printed object as understood in the art.

As the extruded material 15 is extruded through the nozzle 24, an electrical field is created between the electrode layer 22 and the nozzle 24 to pole the extruded material 15 as it is being extruded, causing polarization of the extruded material 15 as it is deposited onto the build plate 14.

To pole the extruded material 15, an adjustable electric field in the range of 0.5 to 4 kV/mm is applied between the electrode layer 22 and the nozzle 24 extending along a poling axis 37 perpendicular to the build plate 14. The electric field is created by a voltage source 39 having an output voltage up to 30 kV (10 W). A positive electrode of the high voltage source 39 may connected to the nozzle 24 while a negative electrode of the high voltage source 39 may connected to the electrode layer 22. The direction of poling along the poling axis 37 dictates the polarity of the extruded material 15, however, the anode and cathode may be switched without affecting the piezoelectric effect of the resulting printed piezoelectric substrate 12. The poling of the extruded material 15 causes the dipoles of the printed piezoelectric substrate 12 to orient in the same direction, leading to a piezoelectric effect of the material.

The electric field can be applied at elevated temperatures, for example, at least 230 degrees Celsius, and at least 250 degrees Celsius, and between 230-290 degrees Celsius, and at temperatures required to properly melt the filament 34. At these elevated temperatures, it would normally be expected that the extruded material 15 would exhibit a significantly lower coercive force, therefore requiring the extruded material 15 to cool prior to effective poling application. However, the concentrated electric field and high processing temperature are favorable for aligning the ferroelectric dipoles in the extruded material 15. Thus, the extruded material 15 is poled simultaneous with extrusion onto the build plate 14 and eliminating the need for separate 3D printing and poling steps.

The printing rate of the extruded material 15 is desirable at less than 20 mm/s, and less than 15 mm/s, and less than 10 mm/s which allows for sufficient poling time and improved dipole alignment than would occur at a faster printing rate, for example, higher than 20 mm/s.

The extruded material 15 may be deposited onto the build plate 14 layer-by-layer with each layer having a thickness of about 0.1 mm to 0.2 mm (100 μm to 200 μm) and the printed piezoelectric substrate 12 having a desired thickness of between 0.1 mm to 0.2 mm (100 μm to 200 μm) for a rolled substrate as described below. The electric field applied to the extruded material 15 and the poling voltage is increased as each layer is added. In one embodiment, the poling voltage may be increased by 100 volts per additional layer. This allows for the effective construction of multilayer piezoelectric structures having greater sensitivity or mechanical action.

Figure 2:
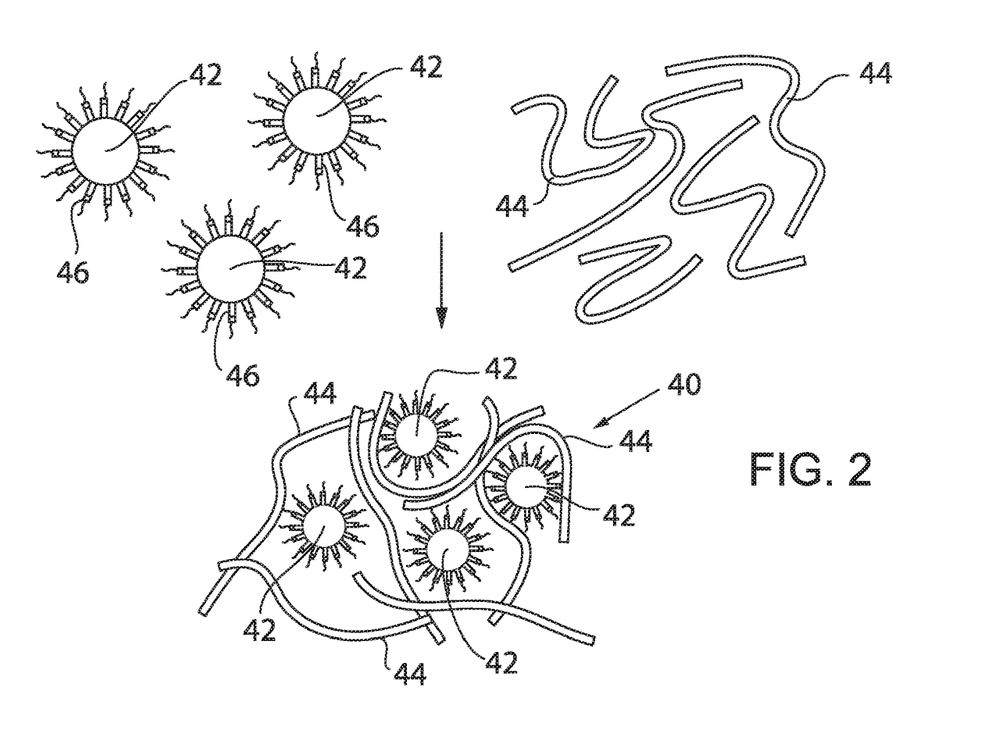
FIG. 2 is a schematic representation of the polymer composite of FIG. 1 with piezoceramic particles of ferroelectric potassium sodium niobate (KNN) particles being combined with a polymer matrix of ferroelectric polyvinylidene fluoride (PVDF)

Referring to FIG. 2, the filament 34 used in the printing process described above to produce the piezoelectric substrate 12 may be a ferroelectric composite 40 formed of ferroelectric potassium sodium niobate (KNN) or KNN-based piezoceramic particles 42 embedded in a ferroelectric polyvinylidene fluoride (PVDF) or PVDF-based polymer 44. The KNN-based piezoceramic particles 42 may include KNN, Li/Sn/Ta-doped KNN, KNN-ABO3 solid solution, and the like. The PVDF-based polymer 44 may include PVDF, PVDF-TrFE, PVDF-HFP, PVDF-CTFE, other PVDF-copolymers, and the like.

The KNN-based piezoceramic particles 42 are a group of high performance, lead-free ferroelectric ceramics. The KNN-based piezoceramic particles 42 possess high piezoelectric properties and have a piezoelectric coefficient ($d_{33}$) of about 100 pC/N and between 80-400 pC/N at room temperature, and a high Curie temperature of at least 270 degrees Celsius and at least 300 degrees Celsius and at least 400 degrees Celsius and between 435-445 degrees Celsius and about 440 degrees Celsius, which assist the composite material in maintaining its ferroelectric phase during high temperature 3D printing. The KNN-based particles piezoceramic 42 have a high dielectric permittivity of about 200 at 10 kHz at room temperature. The KNN-based piezoceramic particles 42 may generate a stable piezoelectric peak-to-peak voltage output ($V_{pp}$) of about 20V and a short-circuited current of about 30 µA under an external force load of 30 N peak load. The KNN-based piezoceramic particles 42 are also biocompatible making them a suitable material for artificial blood vessels.

The KNN-based piezoceramic particles 42 may be prepared to further include 3-(trimethoxysilyl)propyl methacrylate (MPS) 46 that is covalently grafted on the outer surface of the KNN piezoceramic particles 42 to improve the interface compatibility and maximize the dispensability of the KNN piezoceramic particles 42.

The PVDF-based polymers 44 are a group of soft thermoplastic polymers with high printability, flexibility, and acceptable piezoelectricity. The PVDF-based polymers 44 possess piezoelectric properties and have a piezoelectric coefficient ($d_{33}$) of about 20 pC/N at room temperature, and a Curie temperature of between 190 and 200 degrees Celsius and about 195 degrees Celsius, which assist the composite material in maintaining its ferroelectric phase during high temperature 3D printing. The PVDF-based polymers 44 have a high dielectric permittivity of about 12 at 10 kHz at room temperature. The PVDF-based polymers 44 may generate a stable piezoelectric peak-to-peak voltage output ($V_{pp}$) of about 3V and a short-circuited current of about 100 nA under an external force load of 30N peak load. The PVDF-based polymers 44 are also biocompatible making them a suitable material for artificial blood vessels. The PVDF-based polymers 44 have low electrical conductivity.

In one embodiment of the present invention, the filament 34 of ferroelectric composite 40 may be manufactured by the following process.

First, the KNN-based piezoceramic particles 42 may be synthesized using a solid-state reaction. Raw materials of potassium carbonate ($K_2CO_3$, >99%, Sigma), sodium carbonate ($Na_2CO_3$, >99.5%, Sigma), and niobium oxide ($Nb_2O_5$, >99.9%, Alfa Aesar) are uniformly mixed in a molar ratio of 1:1:2 and dried at 210 degrees Celsius for 2 hours to remove absorbed moisture. The dried mixture is then milled for 4 hours and then then calcined at 1100° C. for 4 h followed by slowly cooling the mixture to room temperature to form high-purity KNN ceramics. The KNN ceramics are milled for another 1 hour to form microparticles. The microparticles are refluxed with $H_2O_2$ solution (30%) at 105 degrees Celsius for 2 hours to add a hydroxyl group onto the surface of the microparticles. The samples are collected through centrifuge and rinsed with deionized water three times and dried in an oven. The dried samples are further surface modified through refluxing with 3-(trimethoxysilyl)propyl methacrylate (MPS) (2%) in methanol solution at 70 degrees Celsius for 4 hours. Surface-treated samples are collected, rinsed with methanol, and dried in oven at 80 degrees Celsius overnight.

Second, the surface modified KNN-based piezoceramic particles 42 are mixed with PVDF-based polymers 44, for example, polymer pellets of PVDF (Kynar 720 PVDF), at a volume ratio of 3.5 to 6.5. The mixture is grinded into uniform compositions by a SPEX 6875 Cryogenic Grinder, or added into N,N-dimethylformamide (DMF, >99.8%, Sigma) solvent at 80 degrees Celsius for 1 hour with stirring to form a uniform solution (25 wt % concentration) which is then casted onto a glass dish to form a composite film after evaporating the solvent at 70 degrees Celsius overnight and the films are grinded into fine powders by a SPEX 6875 Cryogenic Grinder.

Third, the ferroelectric composite powder is extruded to form the ferroelectric filament 34 with constant diameter of between 1.7 mm to 3.5 mm, and about 1.7 mm or 3 mm, at 170 degrees Celsius and collected by a winder with a spool collecting the wound filament 34. A laser sensor may be used for filament diameter control.

It is understood that other processes may be used in the manufacture of the filament 34 of ferroelectric composite 40.

Referring to FIGS. 1 and 2, the filament 34 of ferroelectric composite 40 may be used to 3D print a piezoelectric substrate 12 according to the method shown and described with respect to FIG. 1. The ferroelectric composite 40 contains uniform distribution of KNN piezoceramic particles 42 inside the PVDF-based polymer 44 matrix. The ferroelectric composite 40 may consist of 30-40 vol % and about 35 vol % functionalized KNN-based piezoceramic particles 42 and 60-70 vol % and about 65 vol % PVDF-based polymer 44.

The piezoelectric substrate 12 has a piezoelectric coefficient ($d_{33}$) of at least 10 pC/N and at least 12 pC/n and at least 12.4 pC/N at room temperature, and a Curie temperature of at least 250 degrees Celsius. The printed piezoelectric substrate 12 has a permittivity of about 40 at 10 k Hz at room temperature. The printed piezoelectric substrate 12 may generate a stable piezoelectric peak-to-peak voltage output ($V_{pp}$) of at least 2.5 V and about 2.7 V, and a short-circuited current of at least 1 µA and about 1.25 µA, under an external force load of 30 N peak load showing a high piezoelectric output. The piezoelectric peak-to-peak voltage output ($V_{pp}$) remains at at least 2.5 V and about 2.7 V under a repeated force application of 30 N for over 10000 cycles showing the stable piezoelectric output of the piezoelectric substrate 12.

The present inventors believe that the improved piezoelectric properties of the piezoelectric substrate 12 is attributed to the synergistic contribution of both the KNN piezoceramic particles 42 and the PVDF-based polymer 44 (see Table 1 below). The PVDF-based polymer 44 plays an important role in assisting the overall polarization and printability of the composite whereas the KNN piezoceramic particles 42 makes the dominant contribution to the polarization of the composite.

The present inventors have found that the use of alternative composites does not achieve the same favorable piezoelectric characteristics. For example, in polyvinylidene fluoride (PVDF) and barium titanate (BTO), or PVDF-BTO composite, BTO has a low Curie temperature of about 120 degrees Celsius, preventing it from being used for high-temperature printing processes. As a result, the printed film yielded a piezoelectric peak-to-peak voltage output ($V_{pp}$) of 0.3 V, which is much lower than the high piezoelectric output of the present invention and owing to the small amount of β-phase PVDF. In another comparative example, polylactic acid (PLA) and ferroelectric potassium sodium niobate (KNN), or PLA-KNN composite, also displays a lower piezoelectric peak-to-peak voltage output ($V_{pp}$) of 1.7 V.

TABLE 1

|  | Piezoelectric coefficient ($d_{33}$) at room temperature | Curie Temperature ($T_c$) | Peak-to-Peak Voltage ($V_{pp}$) under 30N load |
| --- | --- | --- | --- |
| PVDF | ~20 pC/N | 190-200° C. | ~3 V |
| KNN | ~100 pC/N | 435-445° C. | ~20 V |
| BTO | ~190 pC/N | 100-120° C. | ~4 V |
| PVDF-KNN | ~12.4 pC/N | Determined by KNN | ~2.7 V |
| PVDF-BTO | <1 pC/N | Determined by BTO (lower than KNN composites) | ~0.3 V |
| PLA-KNN | ~7 pC/N | Determined by KNN | ~1.7 V |

Figures 3, 4:
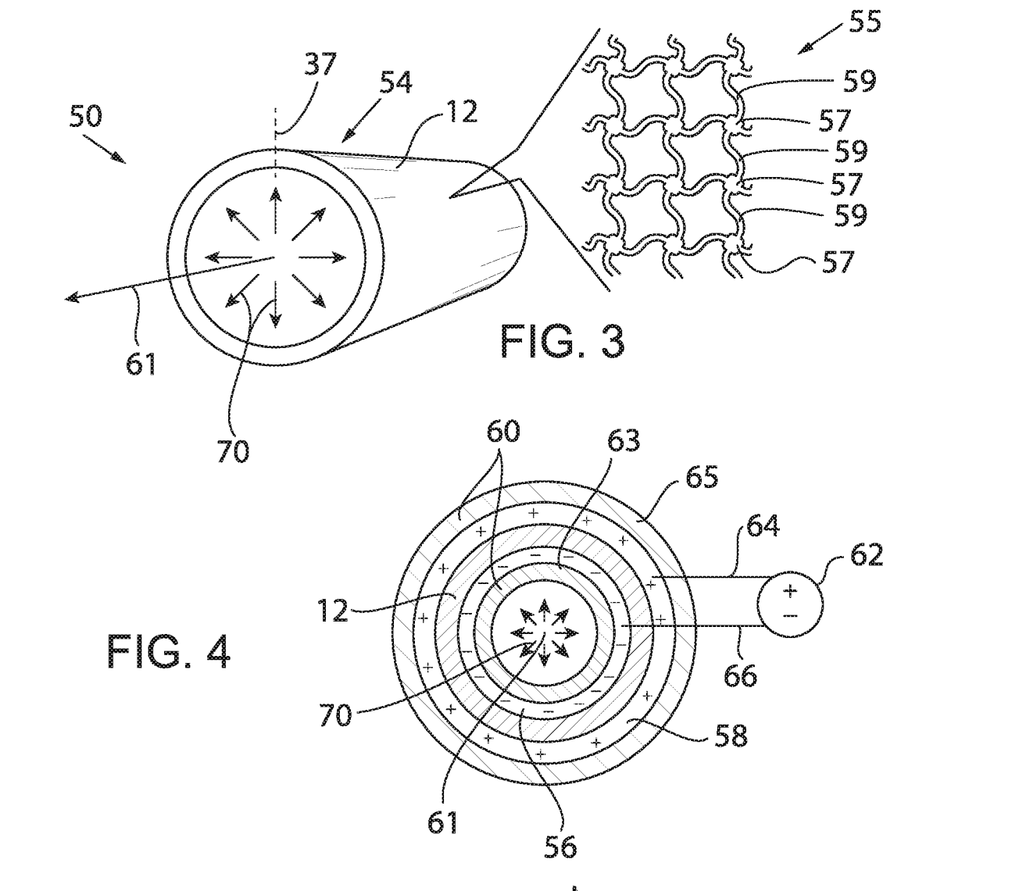
FIG. 3 is a perspective view of a tubular piezoelectric artificial blood vessel formed by the method of FIG. 1 and responding to blood pressure to produce an electric charge and showing an enlarged view of the complex lattice structure of the piezoelectric artificial blood vessel.
FIG. 4 is a cross-sectional view of the piezoelectric artificial blood vessel of FIG. 3 showing the layers of the piezoelectric artificial blood vessel responding to changes in blood pressure and producing a voltage.

Referring now to FIG. 3, the above described method of 3D printing a piezoelectric substrate 12 may be used to print a tubular structure 50 with self-powered sensing capability. In this respect, the tubular structure 50 may also be used as a transducer using an electrical signal to actuate or produce a vibration at the tubular structure 50 and/or receiving the mechanical changes in the tubular structure 50 to produce an electrical signal detected by an external sensor.

In one embodiment of the present invention, the tubular structure 50 may serve as a pressure gauge detecting a pressure flow through the tubular structure 50. In one embodiment of the present invention, the tubular structure 50 may serve as an artificial artery that can be quickly printed for individual patients with no external battery or power source needed to sense the blood pressure and blood vessel motion patterns of the blood vessel.

The tubular structure 50 may be a hollow cylinder 52 with an inner tube 54 formed by the planar, rectangular piezoelectric substrate 12 rolled into a tube, for example, rolled around a mandrel with the outer edges joined along a length of the tube. The inner tube 54 has circular open ends extending along a longitudinal axis 61. The piezoelectric substrate 12 is poled along the poling axis 37 that is normal to the inner and outer surfaces of the rolled piezoelectric substrate 12 and normal to the longitudinal axis 61.

The piezoelectric substrate 12 may be a printed sinusoidal lattice pattern 55. The sinusoidal lattice pattern 55 of the piezoelectric substrate 12 reduces the surface area of the inner tube 54 thus making it more flexible and providing a lower mechanical modulus. The rectangular piezoelectric substrate 12 forming the inner tube has a total area of approximately 18 cm$^2$ but a reduced surface area of approximately 13 cm$^2$ attributed to the openings formed within the substrate by the sinusoidal lattice pattern 55. The sinusoidal lattice pattern 55 may include 30% printed area and 70% openings. The increased flexibility provided by the sinusoidal lattice pattern 55 allows the piezoelectric substrate 12 to be rolled into a flexible tube and without breaking.

As seen in the enlarged inset of FIG. 3, the sinusoidal lattices 55 may comprise of a repeated pattern of equally spaced circles 57 connected by bridges 59 formed by two opposed semicircular arches forming an "S" shape, and which interconnect each of the circles 57 so that each circle 57 is attached to four additional circles 57. The attachment of the bridges 59 are equally spaced on each circle 57 at approximately 90-degree intervals at, for example, 45°, 135°, 225°, and 315° positions around the circles 57. The circles 57 have a radius of about 2 mm. The bridges 59 have two arches with a radius of curvature of about 2.1 mm and an angle of 180 degrees. The bridges 59 may have a total length of about 4 mm and a width of about 0.8 mm.

Figure 5:
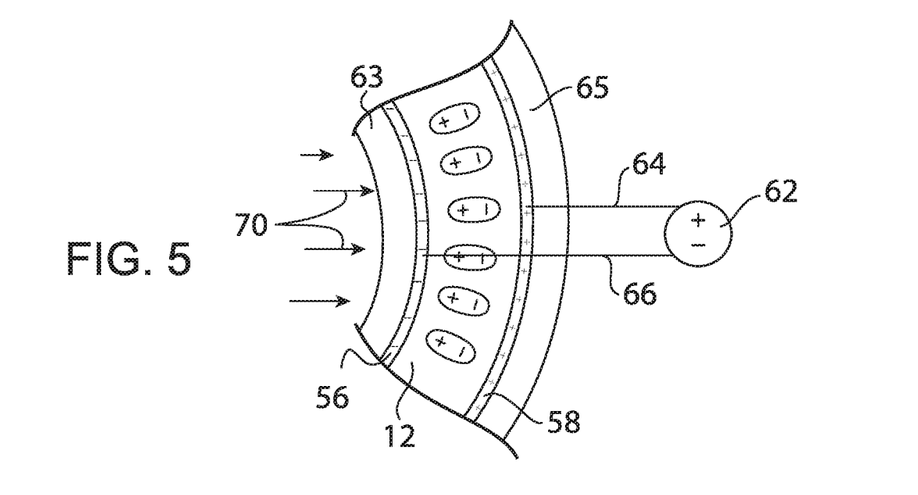
FIG. 5 is an enlarged cross-sectional view of the piezoelectric material having a dipole moment causing a voltage in response to pressure applied on the piezoelectric material by blood pressure changes.

Referring also to FIGS. 4 and 5, the inner tube 54 may further include an inner and outer electrode 56, 58 forming layers covering the inner and outer surfaces, respectively, of the piezoelectric substrate 12. The inner and outer electrodes 56, 58 may be a biocompatible silver paste, for example, EPO-TEK® H20E, printed by a paste extruder. The inner and outer electrodes 56, 58 are biocompatible.

The inner tube 54 of the hollow cylinder 52 may have a thickness of at least 0.1 and at least 0.15 mm and between 0.1 mm and 0.2 mm forming the flexible inner tube 54. The inner tube 54 is biocompatible.

A sheath 60 of the hollow cylinder 52 may surround the inner and outer surfaces of the inner tube 54, respectively. The sheath 60 may be a silicone material such as polydimethylsiloxane (PDMS) having an inner layer 63 surrounding an inner surface of the inner tube 54, an outer layer 65 surrounding an outer surface of the inner tube 54, and ends of the sheath 60 surrounding the ends of the inner tube 54, to therefore completely encapsulate the inner tube 54 such that the inner tube 54 does not contact the exterior of the hollow cylinder 52.

The inner layer 63 and outer layer 65 of the sheath 60 may have a total thickness of at least 1 mm and at least 1.5 mm and between 1 mm and 2 mm to form a durable artificial artery structure encapsulating the inner tube 54. The sheath 60 is biocompatible.

The hollow cylinder 52 may have an inner diameter of 0.8-1.2 cm and about 1.2 cm and an outer diameter of 1.2-1.5 cm and 1.2-1.7 cm and about 1.6 cm. The total length of the hollow cylinder 52 measured along the axis 61 may be at least 1 cm, and at least 2 cm, and at least 3 cm, and at least 4 cm, and between 5 mm and 1.5 cm.

It is understood that in an alternative method, the hollow cylinder 52 may be printed directly, without requiring the rolling of the planar substrate to form the tube, by printing the tube on a rotating mandrel (not shown) whereby the poling axis 37 is radial with respect to the rotating mandrel. The inner and outer electrode 56, 58 may be 3D printed onto the piezoelectric substrate or added separately. The outer tube 60 may also be 3D printed on the inner tube 54 or added separately.

The hollow cylinder 52 exhibits a tissue-comparable elasticity and flexibility with a significantly lower tensile modulus of at least 5 MPa, and at least 5.5 MPa, and about 5.68 MPa (elongation of about 38%) and flexural modulus of at least 10 MPa, and at least 10.3 MPa, and about 10.35 MPa. The tensile modulus and flexural modulus are within comparable ranges as human arteries. The hollow cylinder 52 is composed of a bio-composite and non-toxic materials.

The inner and outer electrode 56, 58 are attached to an electrical or voltage meter 62 via electrical connectors 64, 66. The voltage meter 62 may be a wireless transmitter that can transmit the voltage signals to an external receiver, such as a mobile phone, to monitor changes to blood pressure. The voltage meter 62 may be a pressure sensor that is able to measure the changes in voltage, which is linearly related to the changes in pressure represented by arrows 70 on the piezoelectric substrate 12 caused by changes in blood flow through the hollow cylinder. The mechanical changes to the piezoelectric substrate 12 of the inner tube 54 are caused by the changes in blood flow through the hollow cylinder 52 during vasodilation (widening of the blood vessels) and vasoconstriction (narrowing of the blood vessels). For example, an average adult has a diastolic pressure of 80 mmHg and a systolic pressure of 120 mmHg, and the pressure fluctuates within pressure changes around 40 mmHg (5.33 kPa).

The mechanical changes in the piezoelectric substrate 12 are converted to an electrical charge detected by the voltage meter 62. For example, the changes in blood pressure 70 will result in a positive or negative voltage difference. The polarization of voltage is consistent with the poling direction of the piezoelectric substrate 12 during the 3D printing method described above with respect to FIG. 1.

The tubular structure 50 has a pressure/strain sensitivity of at least 0.3 mV/kPa, $R^2$>0.99 and at least 0.306 mV/mmHg, $R^2$>0.99 (at least 12 mV/kPa and at least 12.2 mV/kPa). Linearity is displayed between electricity and pressure (2.295 mV/kPa, $R^2$>0.99) which shows the capability of accurate real-time monitoring of blood pressure 70 by the tubular structure 50.

The sensing capability of the tubular structure 50 is sensitive enough to detect partial occlusion (e.g., thrombosis) of the artery which can be revealed by the voltage signals. For example, between 0 and 80% occlusion of the artery can be detected. By viewing the voltage profile, asymmetric artery movement and pressure patterns may indicate the dissimilar blood flows at opposite sides of a thrombosis. Therefore, implant failure can be detected early.

The tubular structure 50 may be used in vascular bypass surgeries that redirect blood flow from one area of the body to another by reconnecting the blood vessels. Vascular grafting is most commonly done to bypass a complete or partial blockage in an artery in order to improve blood flow to the organ or extremity supplied by the diseased artery. Vascular grafts are most commonly used in the heart during a coronary artery bypass or in the legs to help treat vascular disease and poor blood flow. During a vascular bypass, the ends of the tubular structure 50 are sewn onto the source and target vessels, respectively, to attach the vessels and bypass the blockage.

In one embodiment of the present invention, the voltage meter 62 may be a transducer used to transmit an electrical signal through the electrical connectors 64, 66 to actuate or produce a vibration response in the piezoelectric substrate 12 and tubular structure 50.

Certain terminology is used herein for purposes of reference only, and thus is not intended to be limiting. For example, terms such as "upper", "lower", "above", and "below" refer to directions in the drawings to which reference is made. Terms such as "front", "back", "rear", "bottom" and "side", describe the orientation of portions of the component within a consistent but arbitrary frame of reference which is made clear by reference to the text and the associated drawings describing the component under discussion. Such terminology may include the words specifically mentioned above, derivatives thereof, and words of similar import. Similarly, the terms "first", "second" and other such numerical terms referring to structures do not imply a sequence or order unless clearly indicated by the context.

When introducing elements or features of the present disclosure and the exemplary embodiments, the articles "a", "an", "the" and "said" are intended to mean that there are one or more of such elements or features. The terms "comprising", "including" and "having" are intended to be inclusive and mean that there may be additional elements or features other than those specifically noted. It is further to be understood that the method steps, processes, and operations described herein are not to be construed as necessarily requiring their performance in the particular order discussed or illustrated, unless specifically identified as an order of performance. It is also to be understood that additional or alternative steps may be employed.

References to "a microprocessor" and "a processor" or "the microprocessor" and "the processor," can be understood to include one or more microprocessors that can communicate in a stand-alone and/or a distributed environment(s), and can thus be configured to communicate via wired or wireless communications with other processors, where such one or more processor can be configured to operate on one or more processor-controlled devices that can be similar or different devices. Furthermore, references to memory, unless otherwise specified, can include one or more processor-readable and accessible memory elements and/or components that can be internal to the processor-controlled device, external to the processor-controlled device, and can be accessed via a wired or wireless network.

It is specifically intended that the present invention not be limited to the embodiments and illustrations contained herein and the claims should be understood to include modified forms of those embodiments including portions of the embodiments and combinations of elements of different embodiments as come within the scope of the following claims. All of the publications described herein, including patents and non-patent publications, are hereby incorporated herein by reference in their entireties.

What we claim is:

1. A tubular pressure gauge comprising:
   a tube having
      a piezoelectric substrate of ceramic piezoelectric particles embedded in a piezoelectric polymer matrix, wherein the substrate is poled perpendicular to inner and outer opposed surfaces of the substrate;
      a first electrode on the inner surface of the substrate;
      a second electrode on the outer surface of the substrate; and
   a voltage meter electrically connected to the first and second electrodes and configured to receive a voltage between the first and second electrodes;
   wherein the piezoelectric substrate is formed in a sinusoidal lattice pattern, having at least 60% openings.

2. The pressure gauge of claim 1 wherein the piezoelectric substrate is ferroelectric potassium sodium niobate (KNN)-based piezoelectric particles embedded in a ferroelectric polyvinylidene fluoride (PVDF)-based polymer matrix.

3. The pressure gauge of claim 2, wherein an amount of KNN piezoelectric particles is 30-40 vol %.

4. The pressure gauge of claim 3, wherein the KNN piezoelectric particles have a Curie temperature of at least 300 degrees Celsius.

5. The pressure gauge of claim 3, wherein the KNN piezoelectric particles have a piezoelectric coefficient of at least 80 pC/n at room temperature.

6. The pressure gauge of claim 1, wherein the piezoelectric substrate generates a voltage output of at least 2.5 V under an external force load of 30N.

7. The pressure gauge of claim 1, wherein the piezoelectric substrate has a thickness between 0.1-0.2 millimeters.

8. The pressure gauge of claim 1, further comprising a sheath encapsulating the piezoelectric substrate and the first and second electrode and forming an outermost and innermost layer of the tube.

9. The pressure gauge of claim 8, wherein the sheath is an inner and outer layer of polydimethylsiloxane (PDMS).

10. The pressure gauge of claim 9, wherein the layers of PDMS have a combined thickness of 1-2 mm.

11. The pressure gauge of claim 1, wherein the inner and outer electrodes are layers of silver ink.

12. The pressure gauge of claim 1, wherein the tube has a tensile modulus of at least 5 MPa.

13. The pressure gauge of claim 1, wherein the tube has a flexural modulus of at least 10 MPa.

14. A method of manufacturing a tubular pressure gauge, the method comprising the steps of:
heating a composite piezoelectric polymer material at a temperature of at least 250 degrees Celsius to form a molten material;
extruding the molten composite material through a 3D printer nozzle;
applying an electrical field between the 3D printer nozzle and a lower build plate to pole the molten material as the molten material is being extruded;
depositing the molten material onto the lower build plate to form a substrate of piezoelectric material, wherein the piezoelectric substrate is formed in a sinusoidal lattice pattern, having at least 60% openings; and
forming a tube having the piezoelectric substrate of ceramic piezoelectric particles embedded in a piezoelectric polymer matrix wherein the substrate is poled perpendicular to inner and outer opposed surfaces of the substrate;
a first electrode on the inner surface of the substrate;
a second electrode on the outer surface of the substrate; and
a voltage meter electrically connected to the first and second electrodes and configured to receive a voltage between the first and second electrodes.

15. The method of claim 14, wherein the electrical field applied is in the range of 0.5-4 kV/mm and the electric field is increased with an increase in build height.

16. The method of claim 14, wherein the molten material is deposited at a print speed of less than 20 mm/s.

17. The method of claim 14, further comprising the step of forming the tube by rolling the substrate of piezoelectric material, wherein the tube has a diameter between 5 mm to 1.5 cm and a length of at least 1 cm.

18. The method of claim 17, further comprising the step of covering inner and outer surfaces of the tube with a layer of polydimethylsiloxane (PDMS).

19. A method of 3D printing a substrate of piezoelectric material for a tubular pressure gauge, the method comprising the steps of:
heating a composite material of ferroelectric potassium sodium niobate (KNN) piezoelectric particles embedded in a ferroelectric polyvinylidene fluoride (PVDF) polymer matrix at a temperature of at least 250 degrees Celsius to form a molten material;
extruding the molten composite material through a 3D printer nozzle;
applying an electrical field between the 3D printer nozzle and a lower build plate to pole the molten material as the molten material is being extruded;
depositing the molten material onto the lower build plate to form the substrate;
wherein the substrate is poled perpendicular to first and second opposed surfaces of the substrate, wherein the piezoelectric substrate is formed in a sinusoidal lattice pattern, having at least 60% openings; and
forming a tube having
the piezoelectric substrate of ferroelectric potassium sodium niobate (KNN)-based piezoelectric particles embedded in a ferroelectric polyvinylidene fluoride (PVDF)-based polymer matrix, wherein the substrate is poled perpendicular to inner and outer opposed surfaces of the substrate;
a first electrode on the inner surface of the substrate;
a second electrode on the outer surface of the substrate; and
a voltage meter electrically connected to the first and second electrodes and configured to receive a voltage between the first and second electrodes.

20. The method of claim 19, wherein an amount of KNN piezoelectric particles is 30-40 vol %.

21. The method of claim 19, wherein the substrate generates a voltage output of at least 2.5 V under an external force load of 30N.

22. The method of claim 19, wherein the substrate has a piezoelectric coefficient of at least 10 pC/N at room temperature.

* * * * *